United States Patent
Chen

(10) Patent No.: US 8,988,106 B2
(45) Date of Patent: Mar. 24, 2015

(54) VOLTAGE MODE DRIVER WITH CURRENT BOOSTER (VMDCB)

(71) Applicant: Taiwan Semiconductor Manufacturing Co., Ltd., Hsin-Chu (TW)

(72) Inventor: Wei Chih Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 67 days.

(21) Appl. No.: 13/917,671

(22) Filed: Jun. 14, 2013

(65) Prior Publication Data

US 2013/0328591 A1    Dec. 12, 2013

Related U.S. Application Data

(63) Continuation-in-part of application No. 13/408,196, filed on Feb. 29, 2012, now Pat. No. 8,487,654.

(51) Int. Cl.
   *H03K 19/0175*    (2006.01)
   *H03K 19/094*    (2006.01)
   *H03K 19/0185*    (2006.01)

(52) U.S. Cl.
   CPC ...... *H03K 19/094* (2013.01); *H03K 19/018521* (2013.01); *H03K 19/018557* (2013.01)
   USPC .................................. 326/82; 326/83; 326/86

(58) Field of Classification Search
   USPC .............. 326/82, 83, 86, 87, 26, 27; 327/112, 327/387
   See application file for complete search history.

(56) References Cited

U.S. PATENT DOCUMENTS

| | | | |
|---|---|---|---|
| 5,220,216 A | 6/1993 | Woo | |
| 6,147,513 A | 11/2000 | Bui | |
| 6,292,015 B1* | 9/2001 | Ooishi et al. | 326/33 |
| 6,617,832 B1* | 9/2003 | Kobayashi | 323/266 |
| 6,704,818 B1 | 3/2004 | Martin et al. | |
| 7,068,077 B1* | 6/2006 | Reinschmidt | 326/83 |
| 7,236,013 B2 | 6/2007 | Kasanyai et al. | |
| 2003/0193350 A1* | 10/2003 | Chow | 326/83 |

* cited by examiner

*Primary Examiner* — Daniel D Chang
(74) *Attorney, Agent, or Firm* — Duane Morris LLP

(57) ABSTRACT

A voltage mode driver circuit able to achieve a larger voltage output swing than its supply voltage. The voltage mode driver circuit is supplemented by a current source or "current booster." The circuit includes a first inverter, a second inverter, and a current source. The first inverter receives a first input and outputs a signal at a node. The second inverter receives a second input signal and outputs an inverted second input signal at the same node. The current source provides current to the node via a first switch, the first switch receiving an input at a first input where the voltage output swing at the node is larger than a power supply voltage applied to the current source. The voltage mode driver circuit uses a stable power supply voltage using a power amplifier with feedback.

20 Claims, 7 Drawing Sheets

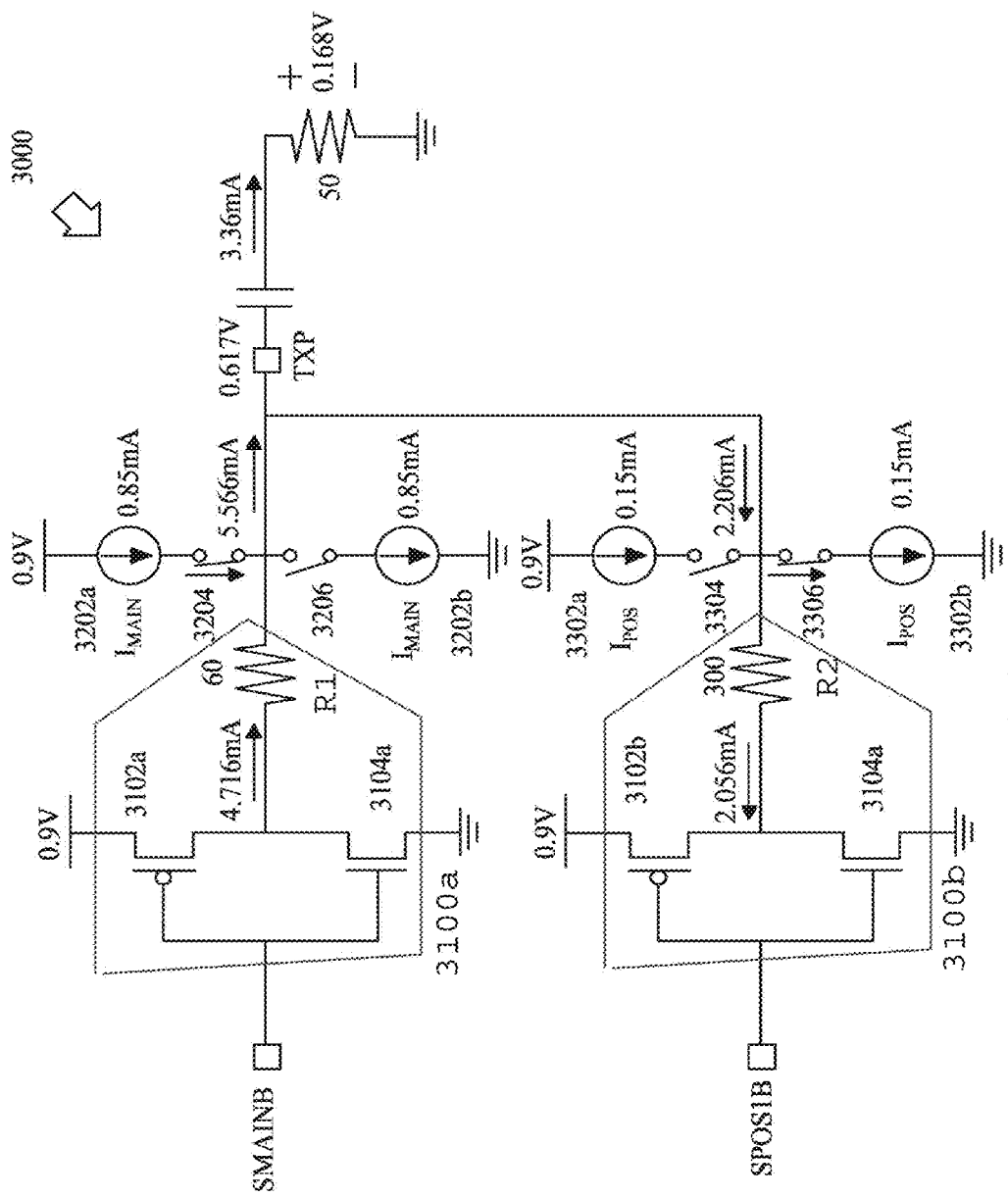

VOLTAGE MODE DRIVER WITH CURRENT BOOSTER (VMDCB)

CROSS-REFERENCE TO RELATED APPLICATIONS

This application is a continuation-in-part of and claims the priority of U.S. Non-Provisional application Ser. No. 13/408, 196, which was filed on Feb. 29, 2012 and which is incorporated by reference herein in its entirety.

TECHNICAL FIELD

Aspects of the present disclosure relate in general to electronic circuitry. In particular, aspects of the disclosure include a Voltage Mode Driver with Current Booster (VMDCB) able to achieve a larger voltage output swing than its supply voltage.

BACKGROUND

The output swing of a conventional Voltage Mode Driver (VMD) structure is limited by the power supply of the circuit. For example, a circuit with a one volt (1 V) power supply can produce a one volt differential peak-to-peak (1 $V_{DIFFPP}$) swing.

However, as semiconductor fabrication processes shrink device sizes smaller and smaller, the supply voltage is typically decreased as well. Consequently, it is difficult to achieve 1 $V_{DIFFPP}$ when supply voltage is less than 1V.

There are several approaches used in the prior art to address this issue.

One approach is to raise the supply voltage. However, raising the supply voltage to overdrive a device often results in a device reliability issue.

Another approach is to adjust the termination to produce a large divided voltage on the receiver side. However, such a change would cause an impedance mismatch, and result in poor signal integrity.

A conventional (PRIOR ART) voltage mode driver (VMD) system 1000 is shown in FIG. 1. Voltage Mode Driver 1100 comprises a pair of p-type transistors 1102, 1106 coupled to n-type transistors 1104, 1108, driving positive output node TXP and negative output node TXN via a supply voltage AVTTR, respectively. The receiver nodes (positive reception node RXP and negative reception node RXN) are modeled as capacitors 1202, 1206 serially connected to resistors 1204, 1208. Assuming the termination is 50 ohms, the receiver's signal amplitude will be AVTTR/4. For example, 1V of AVTTR can produce 0.25V amplitude—which is 1V of $V_{DIFFPP}$ swing.

However, as semiconductor processes shrink, supply voltage sizes are also shrunk. In current state of the art processes, the supply voltage is often below 1V. Consequently, it is difficult to achieve 1V $V_{DIFFPP}$.

When the supply voltages are raised to obtain a higher $V_{DIFFPP}$ output swing, the device reliability is a concern, as the transistors are overstressed.

DESCRIPTION OF THE DRAWINGS

FIGS. 4A and 4B are example use scenarios of a Voltage Mode Driver with Current Booster in accordance with some embodiments.

DETAILED DESCRIPTION

Figure 1:
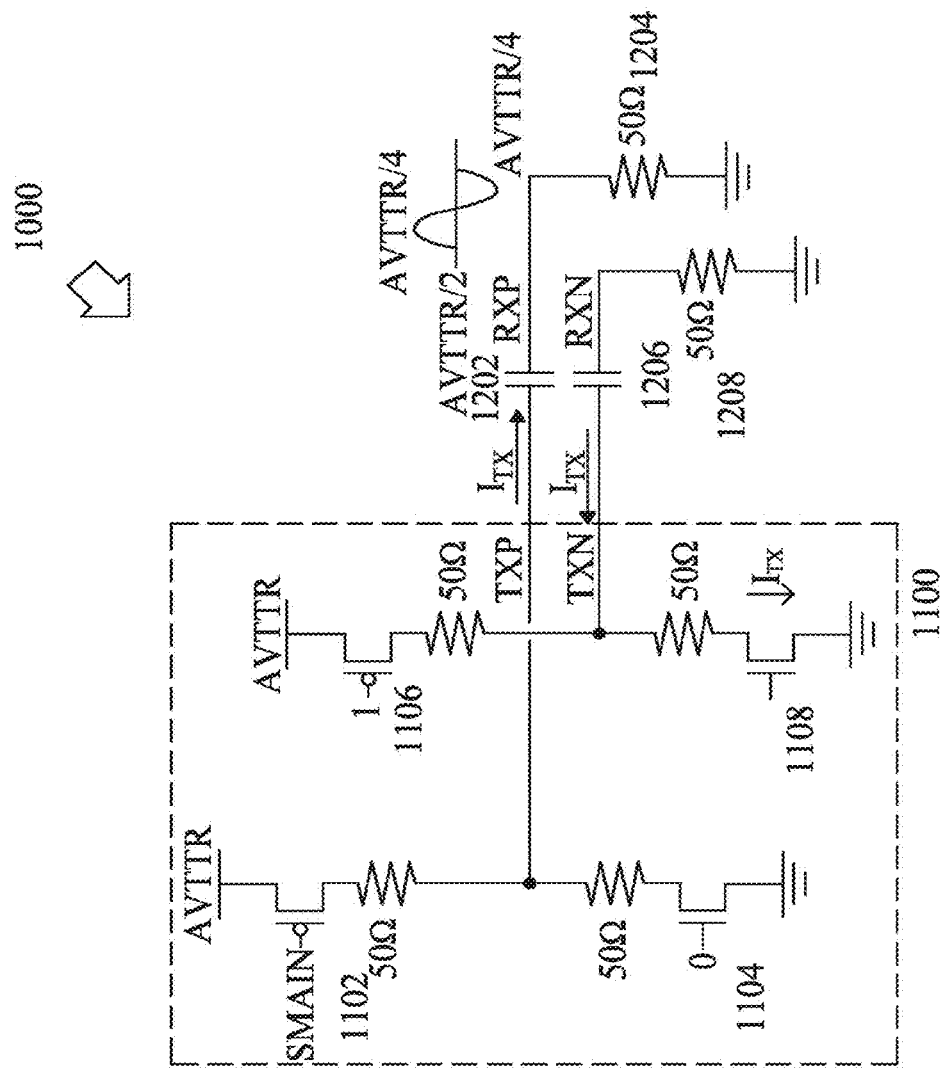
FIG. 1 depicts a conventional Voltage Mode Driver (VMD) structure of the PRIOR ART.

One aspect of the present disclosure includes a voltage mode driver with a current source to boost output swing. Impedance matching with output receivers may be accomplished through the use of high-resistance current sources.

In another aspect, the control is synchronized between the voltage mode driver and current source, ignoring any resulting skew.

Embodiments overcome a lower output voltage swing, and overcome the lower output swing due to headroom decrease in advanced semiconductor processes. This results in lower power consumption and a smaller die-size area.

In some embodiments of the current disclosure, the output voltage swing is somewhat independent of the supply voltage, and instead may be adjusted by the current ratio of parallel current sources.

Embodiments are compatible with any semiconductor process and lower supply voltages. Embodiments with proper impedance matching may result in good output signal integrity, and are more reliable than the prior art.

The following embodiments are described in a plurality of sections. Further, circuit elements making up each of functional blocks of the following embodiments are formed on a semiconductor substrate made of a single crystal silicon by use of the known integrated circuit (IC) technology for Complementary Metal Oxide Semiconductors (CMOS) transistors. With the present embodiments, a MOSFET (Metal Oxide Semiconductor Field Effect Transistor) (abbreviated to MOS transistor) is used as an example of a Metal Insulator Semiconductor Field Effect Transistor (MISFET). However, a non-oxide film is not precluded as a gate insulating film. In the drawings, a symbol O is affixed to a p-channel MOS transistor (PMOS transistor or "p-type" transistor) to be thereby differentiated from an n-channel MOS transistor (NMOS transistor or "p-type" transistor). Further, in the drawings, connection of a substrate potential of a MOS transistor is not specifically shown, however, there is no particular limitation to a connection method thereof if the MOS transistor is present in a normally operable range.

Embodiments of the invention will be described hereinafter with reference to the drawings. In all the drawings for use describing the embodiments, identical members are in principle denoted by like reference numerals, thereby omitting detailed description thereof.

Figure 2:
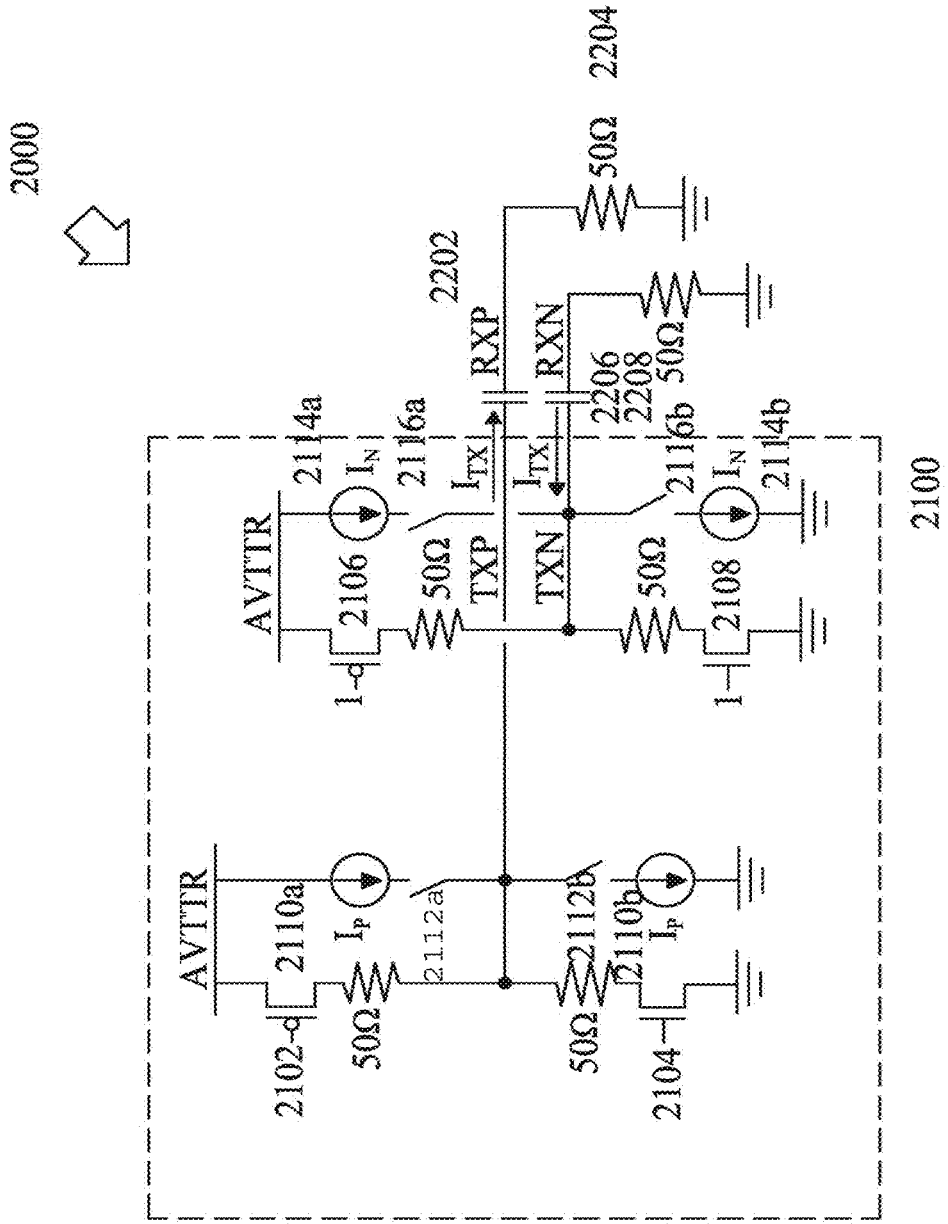
FIG. 2 describes a model of Voltage Mode Driver with Current Booster (VMDCB) circuit.

Let us now turn to an embodiment of a voltage mode divider circuit 2000, shown in FIG. 2. FIG. 2 illustrates an embodiment of a Voltage Mode Driver with current booster 2100, constructed and operative in accordance with an embodiment of the current disclosure. As shown in FIG. 2, Voltage Mode Driver 2100 drives positive output node TXP and negative output node TXN via a supply voltage AVTTR. The receiver nodes (positive reception node RXP and negative reception node RXN) are modeled as capacitors 2202, 2206 serially connected to resistors 2204, 2208.

Voltage Mode Driver 2100 comprises two paths for generating the positive and negative output nodes. We shall refer to these nodes as positive output node TXP and negative output node TXN.

The voltage of positive output node TXP is governed by an inverter with p-type transistor 2102 coupled through resistors to n-type transistor 2104. In parallel to this pair of transistors are current sources 2110*a-b* linked with switches 2112*a-b*. Node TXP may be driven by a power source (labeled AVTTR) serially connected with current source $I_P$ 2110*a* and switch 2112*a*, current source $I_P$ 2110*a* and switch 2112*a* connected to ground, and power source AVTTR serially connected with current source $I_N$ 2114*a* and switch 2116*a*.

Similarly, the voltage of negative output node TXN is governed by an inverter with p-type transistor 2106 coupled to n-type transistor 2108; this transistor pair is further driven by a voltage source linked current source $I_N$ 2114*b* and switch 2116*b* connected to ground. It is understood by those of ordinary skill in the art that transistors 2106 and 2108 receive an opposite signal from transistors 2102 and 2104.

In some embodiments, current sources $I_P$ 2110*a-b* and $I_N$ 2114*a-b* are controllable and adjust to power supply AVTTR voltage changes. Control of switches 2112*a-b*, 2216*a-b* is synchronous with Voltage Mode Divider's 2100 input signal. It is understood by those of ordinary skill in the art that switches 2112*a-b*, 2216*a-b* may be metal-oxide-semiconductor (MOS) switches or any other switches known in the art.

Resistors may be used for impedance matching. In FIG. 2, 50 ohm terminations are shown for each output terminal.

Figure 3:
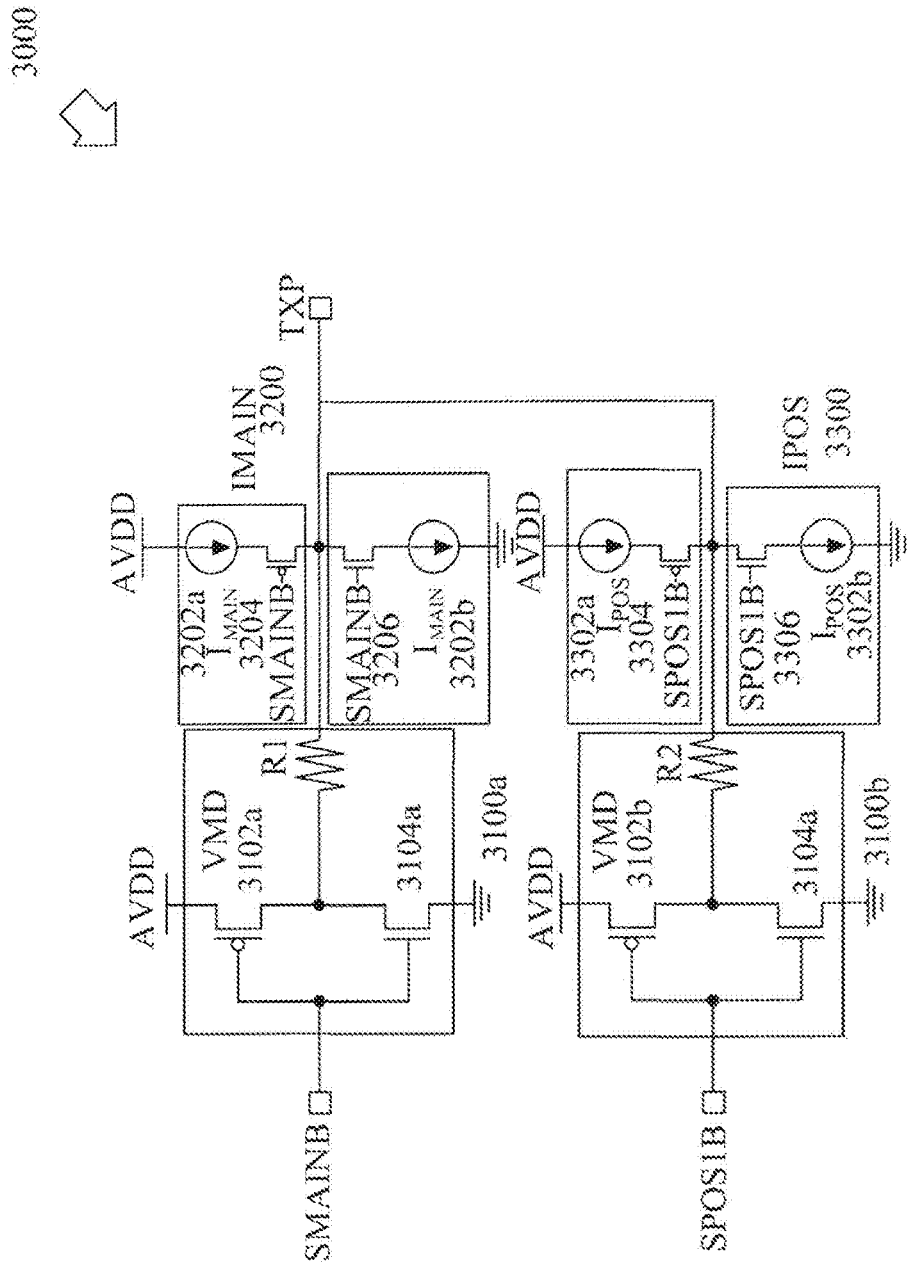
FIG. 3 is one example of an embodiment of a Voltage Mode Driver with Current Booster (VMDCB).

Moving to FIG. 3, another embodiment of a Voltage Mode Driver with Current Booster is depicted, constructed and operative in accordance with an embodiment of the current disclosure. As shown in FIG. 3, Voltage Mode Driver 3000 has a single positive output node TXP and receives opposite inputs SMAINB and SPOS1B; Voltage Mode Driver 3000 is further powered by voltage supply AVDD. The inputs SMAINB are received from a previous buffer chain. Voltage Mode Driver 3000 comprises a pair of impedance matched inverters 3100*a-b*, in parallel with switched current sources IMAIN 3200 and IPOS 3300.

Inverter 3100*a* receives input SMAINB, while inverter 3100*b* receives input SPOS1B. Each inverter 3100 comprises a p-type transistor 3102 coupled to n-type transistor 3104 powered by voltage source AVDD. The gate of each transistor 3102 is connected with the appropriate input, as shown in FIG. 3. The inverter output TXP is impedance matched (using a resistance R1) with an expected receiver.

In addition to the two parallel inverters, TXP is driven with a pair of switched current sources IMAIN 3200 and IPOS 3300. Current sources IMAIN 3200 and IPOS 3300 are used to either "pull-up" or "pull-down" the output voltage.

IMAIN 3200 comprises two current sources Imain 3202*a-b* controlled by switches 3204 3206. Switches 3204 3206 receive input from signal SMAINB. Switch 3204 may be a p-type transistor, while switch 3206 may be an n-type transistor.

Similarly, IPOS 3300 comprises two current sources Ipos 3302*a-b* controlled by switches 3304 3306. Switches 3304 3306 receives input from signal SPOS1B. In some embodiments, switch 3304 is a p-type transistor, while switch 3306 is an n-type transistor.

Figure 3A:
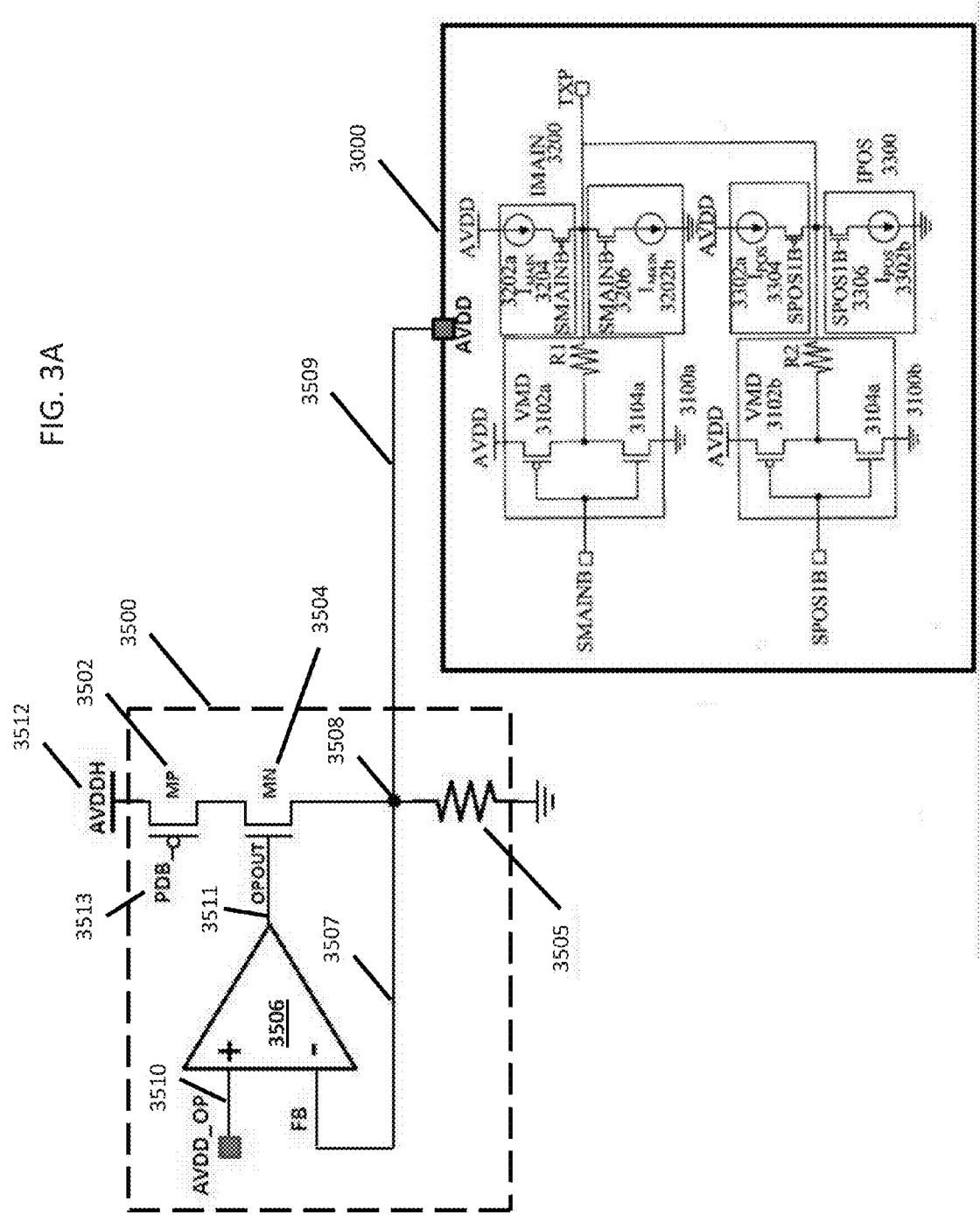
FIG. 3A is an embodiment of a Voltage Mode Driver Current Booster with a reference voltage supply in accordance with some embodiments.

FIG. 3A illustrates the Voltage mode driver 3000 along with a reference voltage supply 3500. In some embodiments, Voltage Mode Driver 3000 has a single positive output node TXP, and receives opposite inputs SMAINB and SPOS1B; Voltage Mode Driver 3000 is further powered by voltage supply AVDD provided by the reference voltage supply 3500. The inputs SMAINB are received from a previous buffer chain. Voltage Mode Driver 3000 comprises a pair of impedance matched inverters 3100*a-b*, in parallel with switched current sources IMAIN 3200 and IPOS 3300.

Inverter 3100*a* receives input SMAINB, while inverter 3100*b* receives input SPOS1B. Each inverter 3100 comprises a p-type transistor 3102 coupled to n-type transistor 3104 powered by voltage source AVDD. The gate of each transistor 3102 is connected with the appropriate input, as shown in FIG. 3A. The inverter output TXP is impedance matched (using a resistance R1) with an expected receiver.

In addition to the two parallel inverters, TXP is driven with a pair of switched current sources IMAIN 3200 and IPOS 3300. Current sources IMAIN 3200 and IPOS 3100 are used to either "pull-up" or "pull-down" the output voltage.

IMAIN 3200 comprises two current sources Imain 3202*a-b* controlled by switches 3204 3206. Switches 3204 3206 receive input from signal SMAINB. Switch 3204 may be a p-type transistor, while switch 3206 may be an n-type transistor. In some embodiments, the current sources Imain 3202*a-b* can provide for variable current adjustment using one or more additional control transistors. For example, current source Imain 3202*a* can be adjusted using one or more manually controlled p-type transistors similar to transistor 3204. Current source Imain 3202*b* can be adjusted using one or more manually controlled n-type transistors similar to transistor 3206.

Similarly, IPOS 3300 comprises two current sources Ipos 3302*a-b* controlled by switches 3304 3306. Switches 3304 3306 receives input from signal SPOS1B. In some embodiments, switch 3304 is a p-type transistor, while switch 3306 is an n-type transistor. In some embodiments, the current sources Ipos 3302*a-b* provide for variable current adjustment. For example, current source Ipos 3302*a* can be adjusted using one or more manually controlled p-type transistors similar to transistor 3304. Current source Imain 3302*b* can be adjusted using one or more manually controlled n-type transistors similar to transistor 3306. In any case, each of the current sources 3202*a-b* or 3302*a-b* can be controlled using a MOS array having one or more MOS transistors.

The reference voltage supply 3500 isolates noise and provides greater tolerance for variability in the specific design. Furthermore, the reference voltage supply 3500 provides a stable voltage supply for the Voltage mode driver current booster circuit 3000. The reference voltage supply 3500 comprises p-type transistor 3502 coupled serially to a n-type transistor 3504 which is coupled to ground via resistor 3505. The drain of the n-type resistor 3504 is also coupled to a negative input of an amplifier circuit 3506 and serves as a feedback loop via feedback line 3507. The gate of transistor 3502 has an input 3513 used to control the reference power supply 3500. When the input 3513 is low, the reference voltage supply 3500 supplies the voltage AVDD. When the input 3513 is high, the reference voltage supply 3500 is powered down. The gate of transistor 3504 receives an output from the amplifier circuit 3506. The reference voltage supply 3500 provides the AVDD supply voltage to the Voltage mode driver current booster circuit 3000. In one embodiment, AVDD is 0.9 volts while the reference voltage supply 3500 itself is powered by a higher voltage AVDDH which can be 1.8 volts.

The power voltage supply 3500 provides a stable voltage by forming a virtual short between a positive amplifier input AVDD_OP 3510 and a negative amplifier input which is the same as the feedback line 3507 described above. As used herein, a virtual short means that the when the voltage difference between two terminals (3510 and 3507) approaches zero there is no difference between the two input terminals and it virtually appears as an electrical short.

An ideal operational amplifier has a negative input (v1), a positive input (v2), and one output voltage (Vo) that equals (v2−v1)*A where A is the gain of the operational amplifier. Thus, (v2−v1)=Vo/A. Usually A is very large and assumed to approach infinity such that Vo/A will approach zero and v2−v1 is the voltage difference between the two terminals which will also be zero. The virtual short can also be considered a virtual open since physically the two terminals are actually open and are not physically connected or do not have current flowing between them. The voltage of the two differential inputs (3510 and 3507) in this instance are just very close to each other. In other words, the condition in an op-amp feedback amplifier where v1=v2 is also known as a virtual short. But physically, the two input terminals are very much open and it is the feedback loop that enforces the condition of v1 equaling v2.

The feedback line 3507 directly connects to the voltage mode driver 3000 as the power supply via line 3509 that is connected to node 3508 to which feedback line 3507 is also connected. The feedback loop via feedback line 3507 also provides stability. Noise can cause the voltage on AVDD_OP 3510 to rise. Thus, when the voltage at AVDD_OP 3510 is greater than the voltage at feedback line 3507, the difference in voltage times the operational amplifier gain causes an voltage level at OPOUT 3511 to rise significantly. Consequently, when the voltage on the feedback line 3507 becomes greater than the voltage at AVDD_OP 3510, then the OPOUT 3511 voltage falls. Accordingly, such feedback causes the voltage level to remain stable.

Figure 3B:
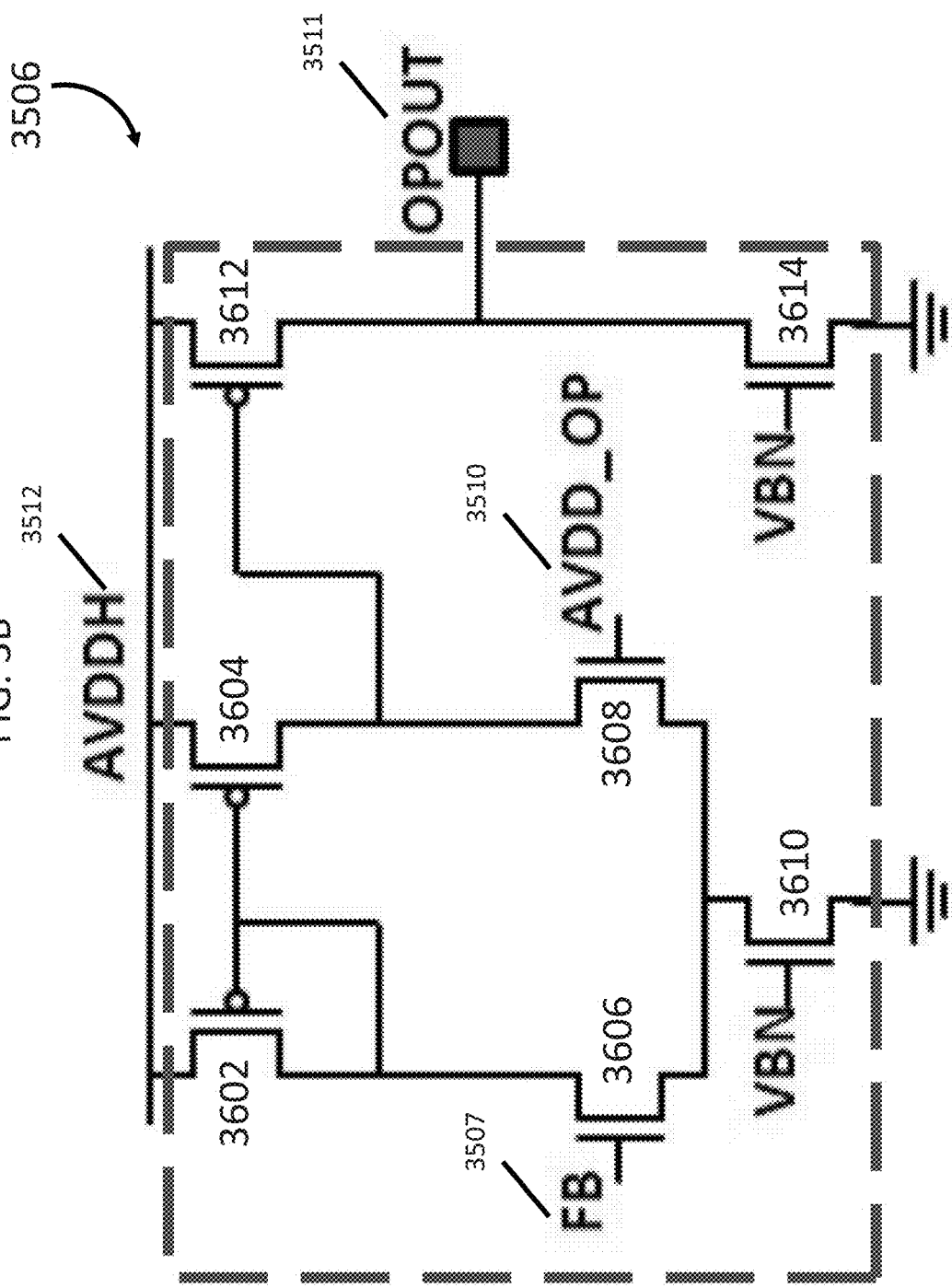
FIG. 3B is an embodiment of an operational amplifier used in the reference voltage supply in accordance with some embodiments.

Referring to FIG. 3B, the amplifier circuit 3506 can be embodied in a number of circuits. For example, the amplifier circuit 3506 can be in the form of a two-stage operational amplifier. A first stage can include a differential amplifier including a pair of NPN transistors 3606 and 3608 coupled to ground via n-type transistor 3610. The first stage further includes a current mirror formed by PNP transistors 3602 and 3604. The feedback line 3507 serves as the input to the gate of NPN transistor 3606. The line AVDD_OP 3510 serves as the input to the gate of NPN transistor 3608. The second stage can include an output stage having PNP transistor 3612 coupled to n-type transistor 3614 which is also coupled to ground. P-type transistor 3612 is connected to the first stage at a node disposed between p-type transistor 2604 and n-type transistor 3608. The output OPOUT 3511 of amplifier 3511 is coupled to a node disposed between p-type transistor 3612 and n-type transistor 3614.

Figure 4A:
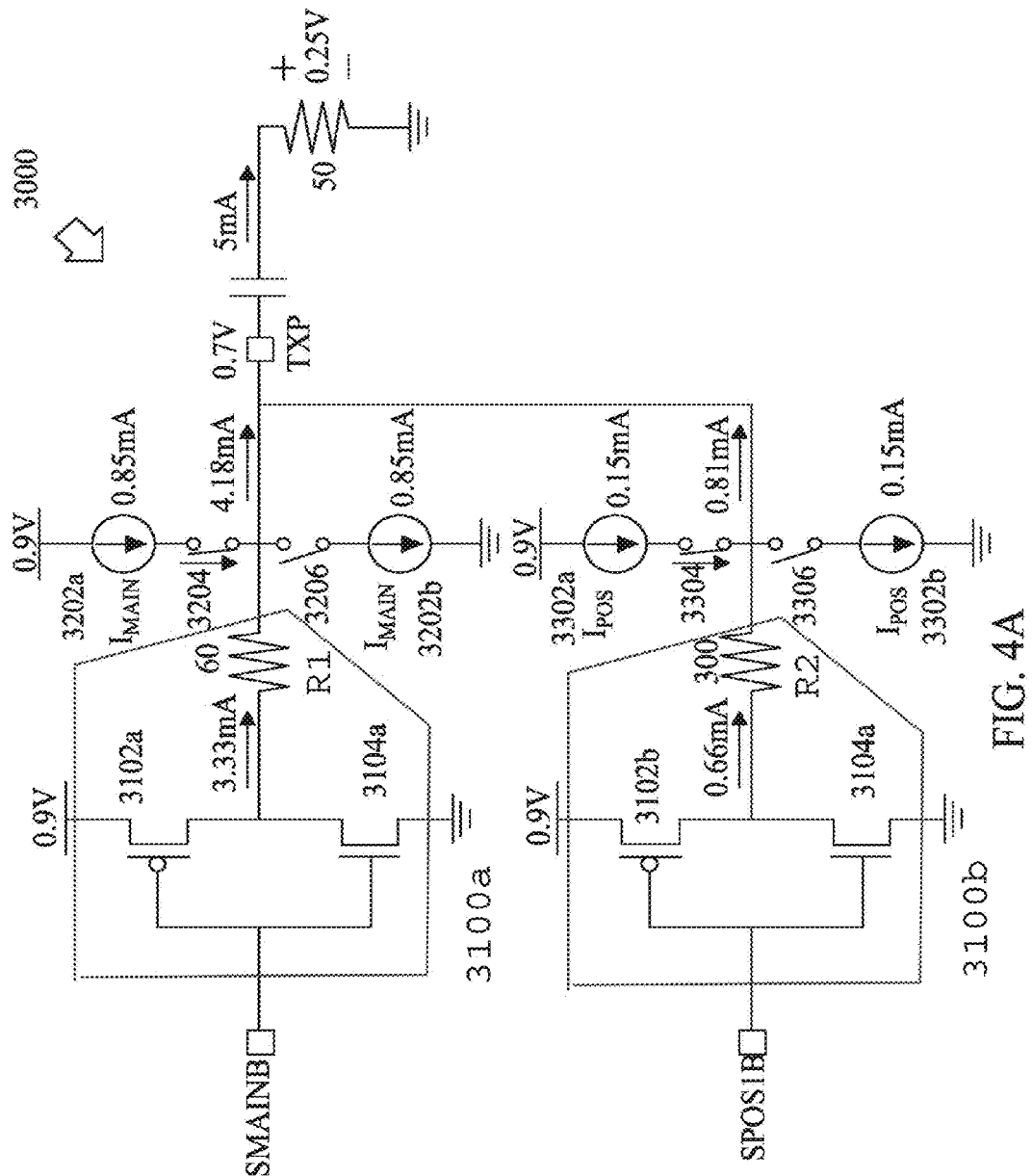

Operation of a Voltage Mode Driver with Current Booster 3000 is better understood thorough FIGS. 4A and 4B, constructed and operative in accordance with an embodiment of the current disclosure. FIGS. 4A and 4B are use scenarios of a Voltage Mode Driver with Current Booster 3000 embodiment. It is understood by those of ordinary skill in the art that the voltage supply, resistance, current supply and other values may be adjusted or changed to fit any particular application. The values of these circuit elements are used for illustrative purposes only to explain a functional operation of such an embodiment.

FIG. 4A is an example of achieving a 1 $V_{DIFFPP}$ when the supply voltage is less than 1V, constructed and operative in accordance with an embodiment of the current disclosure. In this example, power supply AVDD is 0.9V, and the receiver is modeled as a capacitor in series with a 50 ohm resistance.

To achieve a 1V peak-to-peak voltage swing, the receiver pad should produce a voltage swing of half of the voltage supply +/−0.25V. Thus, for a power supply AVDD of 0.9V, the TXP voltage would be 0.7V (i.e., 0.9V/2+0.25V=0.7V).

The current from inverters 3100a and 3100b can be adjusted through setting the appropriate resistance of resistors R1 and R2. In this example, resistor R1 is 60 ohms, while R2 is 300 ohms, respectively. Current from inverter 3100a can therefore be calculated as 3.33 mA (i.e., 0.9V−0.7V/60 ohms), while current from inverter 3100b is 0.66 mA (i.e., 0.9V−0.7V/300 ohms).

Current sources IMAIN 3200 and IPOS 3300 are sized such that their total current output is 1 mA. In this embodiment, IMAIN 3200 is 0.85 mA, while IPOS 3300 is 0.15 mA.

The total driving current from the two inverters and power supplies is therefore 5 mA. The total driving current of 5 mA results in a 1V peak-to-peak voltage swing, even though the voltage supply is 0.9V.

FIG. 4B is an example of achieving a −3.5 dB voltage level swing when the supply voltage is less than 1V, constructed and operative in accordance with an embodiment of the current disclosure. In this example, power supply AVDD is 0.9V, and the receiver is modeled as a capacitor in series with a 50 ohm resistance.

To achieve a −3.5 dB voltage level swing, the receiver pad should produce a voltage swing of half of the voltage supply +/−0.167V. Thus, for a power supply AVDD of 0.9V, the TXP voltage would be 0.617V (i.e., 0.9V/2+0.167V=0.617V).

The current from inverters 3100a and 3100b can be adjusted through setting the appropriate resistance of resistors R1 and R2. Like the previous example, resistor R1 is 60 ohms, while R2 is 300 ohms, respectively. Current from inverter 3100a can therefore be calculated as 4.716 mA (i.e., 0.9V−0.617V/60 ohms), while current from inverter 3100b is 2.056 mA (i.e., 0.9V−0.617V/300 ohms).

Again, current sources IMAIN 3200 and IPOS 3300 are sized such that their total current output is 1 mA. In this embodiment, IMAIN 3200 is 0.85 mA, while IPOS 3300 is 0.15 mA.

The total driving current from the two inverters and power supplies is therefore 3.36 mA. The total driving current of 3.36 mA results in a −3.5 dB voltage level swing, even though the voltage supply is 0.9V.

In some embodiments, a voltage mode driver circuit includes a first inverter configured to receive a first input signal at a first input node, invert the first input signal, and output an inverted first input signal at a positive output node and a second inverter configured to receive a second input signal, invert the second input signal and output an inverted second input signal at the positive output node. The voltage mode driver circuit further includes a first current source configured to provide current to the positive output node via a first switch, where the first switch is configured to receive an input at the first input node and where a voltage output swing at the positive output node is larger than a power supply voltage applied to the first current source. In some embodiments, the power supply provides the power supply voltage and includes a p-type transistor coupled to an n-type transistor having a drain coupled to ground and to a negative input of an amplifier, the amplifier providing an output serving as an input to the gate of the n-type transistor and the amplifier having the power supply voltage as an input to a positive input of the amplifier.

In some embodiments, a voltage mode driver circuit includes a second current source serially coupled to the positive output node via a second switch, the second switch configured to receive an input and the power supply voltage is less than 1 volt. In other embodiments, the first inverter further includes a first p-type transistor with a first p-type gate, a first p-type source and a first p-type drain where the first p-type gate is connected to the first input node, the first p-type source is connected to a power supply. The first inverter also includes a first n-type transistor with a first n-type gate, a first n-type source and a first n-type drain where the first n-type gate is connected to the first input node, the first n-type source is connected to a ground, the first n-type drain is connected to the first p-type drain and further including a first resistance, the first resistance being serially connected to the first p-type drain and the positive output node.

In some embodiments, the second inverter further includes a second p-type transistor with a second p-type gate, a second p-type source and a second p-type drain, the second p-type gate being connected to the first input node, the second p-type source being connected to the power supply, a second n-type transistor with a second n-type gate, a second n-type source and a second n-type drain, the second n-type gate being connected to the first input node, the second n-type source being connected to a ground, the second n-type drain being connected to the p-type drain, and a second resistance, the second resistance being serially connected to the second p-type drain and the positive output node. In some embodiments, the first current source is also serially coupled between the positive output node and ground via a third switch. In some embodiments, the second current source is also serially coupled between the positive output node and ground via a fourth switch. In some embodiments, the first switch is a p-type transistor, the second switch is a p-type transistor. the third switch is an n-type transistor, or the fourth switch is an n-type transistor.

In some embodiments, the first resistance is impedance matched with an expected receiver at the positive output node or the second resistance is impedance matched with the expected receiver at the positive output node. In one aspect, the power supply is 0.9V, the first resistance is 60 ohms, the second resistance is 300 ohms, the first current source is 0.85 mA, or the second current source is 0.15 mA.

In some embodiments, a voltage mode driver circuit includes a first p-type transistor with a first p-type gate, a first p-type source and a first p-type drain, the first p-type source being connected to a power supply, the first p-type drain being serially coupled with an output node via a first resistance, the output node having a voltage output swing larger than a power supply voltage applied by the power supply, the power supply providing a power supply voltage, the power supply comprising a p-type transistor coupled to an n-type transistor having a drain coupled to ground and to a negative input of an amplifier, the amplifier providing an output serving as an input to the gate of the n-type transistor and the amplifier having the power supply voltage as an input to a positive input of the amplifier. The voltage mode driver circuit further includes a first n-type transistor with a first n-type gate, a first n-type source and a first n-type drain, the first n-type source connects to ground, and the first n-type drain serially couples with the output node via a second resistance. In some embodiments, a first current source serially couples between the power supply and the output node via a first switch and a second current source serially couples between ground and to the output node via a second switch.

In some embodiments, a voltage mode driver circuit includes a first inverter configured to receive an input at a main node and provide an output at an output node, a second inverter configured to receive receive an input at a positive node and provide an output at the output node, and a first current source serially coupled to the node TXP via a first switch, the first switch configured to receive via a first switch an input at the main node, where a voltage output swing at the output node is larger than a power supply voltage applied to the voltage mode driver circuit. In some embodiments, the power supply voltage is provided by a power supply having a p-type transistor coupled to an n-type transistor having a drain coupled to ground and to a negative input of an amplifier, the amplifier providing an output serving as an input to the gate of the n-type transistor and the amplifier having the power supply voltage as an input to a positive input of the amplifier. In some embodiment, the voltage mode driver circuit further includes a second current source serially coupled to the positive output node via a second switch, the second switch configured to receive an input and where the power supply voltage is less than 1 volt.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

What is claimed is:

1. A voltage mode driver circuit, comprising:
   a first inverter configured to receive a first input signal at a first input node, invert the first input signal, and output an inverted first input signal at a positive output node;
   a second inverter configured to receive a second input signal, invert the second input signal and output an inverted second input signal at the positive output node;
   a first current source configured to provide current to the positive output node via a first switch, wherein the first switch is configured to receive an input at the first input node and where a voltage output swing at the positive output node is larger than a power supply voltage applied to the first current source,
   wherein the power supply provides the power supply voltage and includes a p-type transistor coupled to an n-type transistor having a drain coupled to ground and to a negative input of an amplifier, the amplifier providing an output serving as an input to the gate of the n-type transistor and the amplifier having the power supply voltage as an input to a positive input of the amplifier.

2. The voltage mode driver circuit of claim 1, further comprising a second current source serially coupled to the positive output node via a second switch, the second switch configured to receive an input and wherein the power supply voltage is less than 1 volt.

3. The voltage mode driver circuit of claim 2, the first inverter further comprising:
   a first p-type transistor with a first p-type gate, a first p-type source and a first p-type drain; the first p-type gate being connected to the first input node, the first p-type source being connected to a power supply; and
   a first n-type transistor with a first n-type gate, a first n-type source and a first n-type drain; the first n-type gate being connected to the first input node, the first n-type source being connected to a ground, the first n-type drain being connected to the first p-type drain; and
   a first resistance, the first resistance being serially connected to the first p-type drain and the positive output node.

4. The voltage mode driver circuit of claim 3, the second inverter further comprising:
   a second p-type transistor with a second p-type gate, a second p-type source and a second p-type drain; the second p-type gate being connected to the first input node, the second p-type source being connected to the power supply; and a second n-type transistor with a second n-type gate, a second n-type source and a second n-type drain; the second n-type gate being connected to the first input node, the second n-type source being connected to a ground, the second n-type drain being connected to the p-type drain; and a second resistance, the second resistance being serially connected to the second p-type drain and the positive output node.

5. The voltage mode driver circuit of claim 4, wherein the first current source is also serially coupled between the positive output node and ground via a third switch.

6. The voltage mode driver circuit of claim 5, wherein the second current source is also serially coupled between the positive output node and ground via a fourth switch.

7. The voltage mode driver circuit of claim 6, wherein the first switch is a p-type transistor.

8. The voltage mode driver circuit of claim 7, wherein the second switch is a p-type transistor.

9. The voltage mode driver circuit of claim 8, wherein the third switch is an n-type transistor.

10. The voltage mode driver circuit of claim 9, wherein the fourth switch is an n-type transistor.

11. The voltage mode driver circuit of claim 10, wherein the first resistance is impedance matched with an expected receiver at the positive output node.

12. The voltage mode driver circuit of claim 11, wherein the second resistance is impedance matched with the expected receiver at the positive output node.

13. The voltage mode driver circuit of claim 12, wherein the power supply is 0.9V.

14. The voltage mode driver circuit of claim 13, wherein the first resistance is 60 ohms.

15. The voltage mode driver circuit of claim 14, wherein the second resistance is 300 ohms.

16. The voltage mode driver circuit of claim 13, wherein the first current source is 0.85 mA.

17. The voltage mode driver circuit of claim 14, wherein the second current source is 0.15 mA.

18. A voltage mode driver circuit comprising:
a first p-type transistor with a first p-type gate, a first p-type source and a first p-type drain; the first p-type source being connected to a power supply; the first p-type drain being serially coupled with an output node via a first resistance, the output node having a voltage output swing larger than a power supply voltage applied by the power supply, the power supply providing a power supply voltage, the power supply comprising a p-type transistor coupled to an n-type transistor having a drain coupled to ground and to a negative input of an amplifier, the amplifier providing an output serving as an input to the gate of the n-type transistor and the amplifier having the power supply voltage as an input to a positive input of the amplifier;

a first n-type transistor with a first n-type gate, a first n-type source and a first n-type drain; the first n-type source being connected to ground; the first n-type drain being serially coupled with the output node via a second resistance;

a first current source serially coupled between the power supply and the output node via a first switch;

a second current source serially coupled between ground and to the output node via a second switch.

19. A voltage mode driver circuit, comprising:
a first inverter configured to receive an input at a main node and providing an output at an output node;

a second inverter configured to receive an input at a positive node and providing an output at the output node; and a first current source serially coupled to the node TXP via a first switch, the first switch configured to receive an input at the main node, wherein a voltage output swing at the output node is larger than a power supply voltage applied to the voltage mode driver circuit, the power supply voltage being provided by a power supply comprising a p-type transistor coupled to an n-type transistor having a drain coupled to ground and to a negative input of an amplifier, the amplifier providing an output serving as an input to the gate of the n-type transistor and the amplifier having the power supply voltage as an input to a positive input of the amplifier.

20. The voltage mode driver circuit of claim 19, further comprising:
a second current source serially coupled to the positive output node via a second switch, the second switch configured to receive an input and wherein the power supply voltage is less than 1 volt.

* * * * *